United States Patent [19]

Houdard et al.

[11] 4,323,980
[45] Apr. 6, 1982

[54] DIGITAL FILTER FOR SHARED-TIME PROCESSING ON SEVERAL CHANNELS

[75] Inventors: Jean-Pierre Houdard, Orsay; Jean-Jacques Julie, Paris; Bernard G. Leoni, Brundy, all of France

[73] Assignee: Le Materiel Telephonique Thomson-CSF, Columbes, France

[21] Appl. No.: 113,039

[22] Filed: Jan. 17, 1980

[30] Foreign Application Priority Data

Jan. 29, 1979 [FR] France .............................. 79 02163

[51] Int. Cl.³ .......................................... G06F 15/31
[52] U.S. Cl. ................................................ 364/724
[58] Field of Search ........................................ 364/724

[56] References Cited

U.S. PATENT DOCUMENTS

| | | | |
|---|---|---|---|
| 3,689,844 | 9/1972 | Buzzard et al. | 364/724 X |
| 3,717,754 | 2/1973 | Buzzard et al. | 364/724 |
| 4,125,900 | 11/1978 | Betts | 364/724 |

*Primary Examiner*—Jerry Smith
*Attorney, Agent, or Firm*—Roland Plottel

[57] ABSTRACT

A digital filter for shared-time processing on several channels. The filter has several elementary cells ($C_1$ to $C_K$), each comprising a read-write memory ($M_1$ to $M_K$), a read-only memory ($H_1$ to $H_K$), and an arithmetic unit ($U_1$ to $U_K$). A page address counter $CT_1$, a word address counter $CT_2$ and a weighting coefficient address counter $CT_3$ are common to the cells. Delayed discrete values are transferred by the relative addressing of the memory words. The filter will find particular application as a half-band extrapolator filter for telephone switching.

6 Claims, 4 Drawing Figures

DIGITAL FILTER FOR SHARED-TIME PROCESSING ON SEVERAL CHANNELS

FIELD OF THE INVENTION

The invention relates to processing digital signals. More particularly, in a preferred embodiment, this invention relates to methods and apparatus for filtering digital signals, as well as to a transversal digital filter, for practicing the method, in particular for shared-time processing of digital signals from several channels, or for use in extrapolation networks.

DISCUSSION OF THE PRIOR ART

When it is required to digitally filter a sampled signal without introducing propagation-time distortion, it is preferable to use a non-recursive filter with linear phase change. Moreover, in order to respect the tight tolerances for the amplitude and propagation-time distortion characteristics, the non-recursive filter must be a high-order filter (at least 50), and it is difficult to process in shared time a large number of channels, even with extremely high-speed arithmetical operators. In addition, the known digital filters which are capable of shared-time processing on several channels are large and relatively costly.

The subject of the present invention is a method of processing digital signals for filtering, this process allowing the fastest possible filtering with the best possible amplitude and propagation time characteristics, especially in the case of shared-time processing on several channels.

The present invention also relates to a digital filter which is capable of implementing the method, said filter operating as fast as possible, with presently available off the shelf digital circuits and having the best possible amplitude and propagation time characteristics for a very short given processing time, said filter also having the smallest possible size and cost.

SUMMARY OF THE INVENTION

The method in accordance with the present invention, which is intended to process successive signal samples, including, in particular the signals which appear on a plurality of time-multiplexed transmission channels, comprises entering, during each sampling time slot and for each channel, the corresponding sample into a random access memory in place of the oldest sample, reading in succession from this memory all the samples of the same channel, starting with that which has just been written and progressing in the order of increasing age to the oldest sample and then, sending the different samples read in this manner to an arithmetic unit for appropriate weighting.

According to another aspect of the method described by the invention, if several random access memories are used, an incident sample is written into the first of these memories in place of the oldest sample, and then all the memories are simultaneously read in the order of increasing age, starting with the sample which has just been written, and, after reading, transferring the contents of each memory to the next memory the oldest sample, starting with the next to last memory, the memories being arranged in the order of increasing ages of their contents.

An M-order digital filter in accordance with the present invention, allowing the processing of digital signals including, in particular, the shared-time processing of digital signals appearing on I transmission channels, comprises: K processing cells, K being a whole number equal to or greater than 1, each of the K cells comprising a random access memory organized in I pages, each page corresponding to a channel and capable of storing at least P words of q bits each, where $M=KP-1$, the memory being intended for storing delayed discrete values; a read-only memory having a capacity of at least P words of r bits each for storing the weighting coefficients of the different delayed discrete values; and an arithmetic unit the filter further comprises a modulo-I counter common to the K cells, for addressing the said I pages a first modulo-P counter, common to the K cells, for ordering the writing, reading and transfer of the said delayed discrete values and a second modulo-P counter, common to the K cells, for addressing the weighting coefficients corresponding to the operation to be performed.

An alternate embodiment of the filter comprises a summing device common to the K cells for calculating the sum of the different partial results produced by each arithmetic unit.

The present invention will be more easily understood from the following detailed description when taken with the appended drawing, in which:

DETAILED DESCRIPTION

Figure 1:
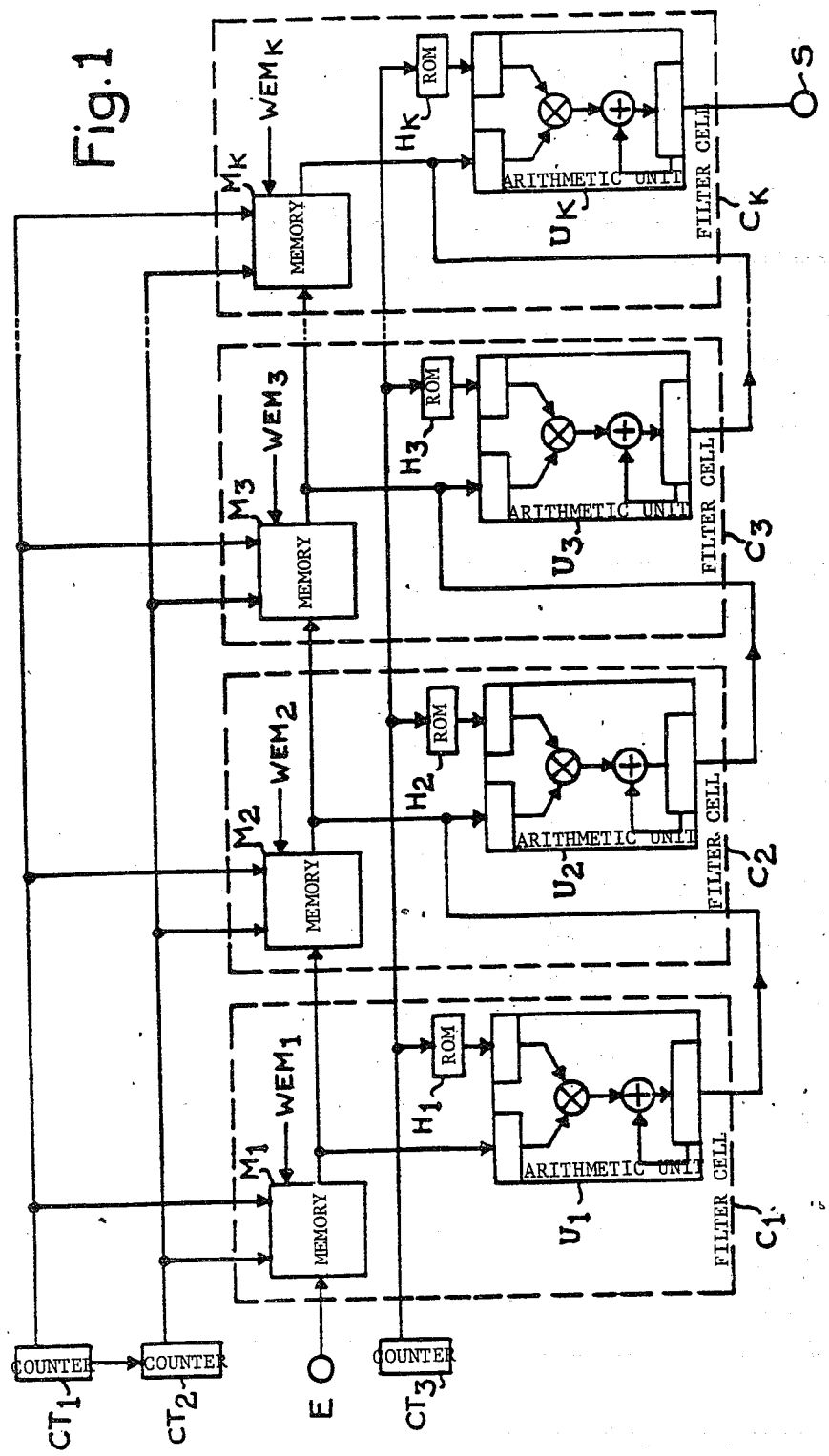
FIG. 1 is the block diagram of a non-recursive digital filter in accordance with the present invention.

The non-recursive digital filter shown in FIG. 1 is intended for the shared-time processing of digital signals appearing on I transmission channels, for example 32 channels in the case of PCM telephone equipment. It should be understood, however, that this filter can also process signals appearing on a single transmission channel.

The M-order digital filter shown in FIG. 1 essentially comprises K elementary filter cells simultaneously processing samples, these cells being designated $C_1$ to $C_K$ and the input signals to be processed appearing on terminal E connected to the first cell $C_1$ and exiting, after being processed, on a terminal 5 connected to the last cell $C_K$. This filter also comprises a modulo-I counter $CT_1$, a modulo-P counter $CT_2$ and a modulo-P counter $CT_3$, these three counters being common to the K cells $C_1$ to $C_K$ and whose purposes are explained below.

Each elementary cell $C_1$ to $C_K$ comprises a random access memory (RAM) $M_1$ to $M_K$ respectively, a read-only memory $H_1$ to $H_K$ respectively, and an arithmetic unit $U_1$ to $U_K$ respectively.

Each RAM $M_1$ to $M_K$ is a parallel-write memory storing P.I words, i.e. a memory having I pages corresponding to the I channels, each page capable of storing at least P words of q bits each, these q bits being written simultaneously into the memory. The output of each random access memory is connected to the input of the RAM of the next filter cell and also to the operand input of the arithmetic unit belonging to its own cell. The digital filter thus comprises K elementary cells, each cell containing P delayed discrete values, where M=PK−1, it being understood that P does not define the order of each cell. As explained below, the incident digital signal samples are stored in the first of these random access memories as and when they appear and are fictively shifted inside this same memory, and only the oldest sample is effectively transferred from one memory to the next. This, therefore, constitutes a delay line similar to a conventional, transversal digital filter, and each of the read-write memory words is known as a delayed discrete value, as in the case of a conventional filter.

Each arithmetic unit $U_1$ to $U_K$ is a parallel multiplier-accumulator of known design and having the highest possible performance, for example the TRW integrated circuit No. TDC 1010J. The output of each arithmetic unit is connected to the operand input of the arithmetic unit belonging to the next cell.

are contained in pages 0 (corresponding to channel 0) of memories $M_1$, $M_2$, $M_3$ and $M_4$ and at addresses 1, 2 and 3 of these memories:

TABLE I

| Memory | Memory address | | | |
|---|---|---|---|---|
| | 0 | 1 | 2 | 3 |
| $M_1$ | $x_0(nT)$ | $x_0[(n-1)T]$ | $x_0[(n-2)T]$ | $x_0[(n-3)T]$ |
| $M_2$ | $x_0[(n-4)T]$ | $x_0[(n-5)T]$ | $x_0[(n-6)T]$ | $x_0[(n-3)T]$ |
| $M_3$ | $x_0[(n-8)T]$ | $x_0[(n-9)T]$ | $x_0[(n-10)]$ | $x_0[(n-7)T]$ |
| $M_4$ | $x_0[(n-12)T]$ | $x_0[(n-13)T]$ | $x_0[(n-14)T]$ | $x_0[(n-11)T]$ |

(Remark: $x_0[(n-3)T]$ is simultaneously in $M_1$ and $M_2$ at address 3 because of the memory to memory transfer, as explained below).

At the instant $x_0[(n+1)T]$ appears, memories $M_1$ to $M_4$ are all at address 3 of page 0 under the control of counter $CT_3$. A write order WE $M_1$ produced by a sequencing device of known type (not shown), stores $x_0[(n+1)T]$ at address 3 of page 0 of memory $M_1$ in place of $x_0[(n-3)T]$.

Since pages 0 of memories $M_1$ to $M_4$ are still selected, the delayed discrete values are then read and weighted by the associated coefficients $h_0$ to $h_{15}$ in four phases from address 3 simultaneously for the four memories $M_1$ to $M_4$, the reading of the weighting coefficients $h_0$ to $h_{15}$ being controlled by counter $CT_3$ for transmission to the respective arithmetic units.

TABLE II

| Memory | Phase | | | |
|---|---|---|---|---|
| | 1 | 2 | 3 | 4 |
| $M_1$ | $x_0[(n+1)T]h_0$ | $x_0[nT]h_1$ | $x_0[(n-1)T]h_2$ | $x_0[(n-2)T]h_3$ |
| $M_2$ | $x_0[(n-3)T]h_4$ | $x_0[(n-4)T]h_5$ | $x_0[(n-5)T]h_6$ | $x_0[(n-6)T]h_7$ |
| $M_3$ | $x_0[(n-7)T]h_8$ | $x_0[(n-8)T]h_9$ | $x_0[(n-9)T]h_{10}$ | $x_0[(n-10)T]h_{11}$ |
| $M_4$ | $x_0[(n-11)T]h_{12}$ | $x_0[(n-12)T]h_{13}$ | $x_0[(n-13)T]h_{14}$ | $x_0[(n-14)T]h_{15}$ |

Each read-only memory $H_1$ to $H_K$ has a capacity of at least P words of r bits each, and is used for storing the weighting coefficients $h_o$ to $h_{m-1}$, each of which remains at the same address of the corresponding memory. The output of each of these memories $H_1$ to $H_K$ is connected to the operator input of the corresponding arithmetic unit.

Counter $CT_1$ controls the addressing of the I pages of the K memories $M_1$ to $M_K$, counter $CT_2$ controls the addressing of the K memories $M_1$ to $M_K$ for executing delayed discrete value write, read and transfer operations, and counter $CT_3$ controls the addressing of the K memories $H_1$ to $H_K$ in order to obtain the weighting coefficients corresponding to the read delayed discrete values.

The following describes the operation of the digital filter illustrated in FIG. 1 in the simplified case for which K=4 and P=4, it being understood that K can be any whole number from K=1 to a theoretically unlimited value, and P can also have any whole value.

If T is the sampling period of signals $x_i(nT)$ on each of the I channels to be processed, the digital filter, operating in shared-time on I channels, must therefore synthesize the output samples $y_i(nT)$ in a time less than T/I seconds, switching from one channel to the next every T/I seconds.

In order to simplify the description, it is assumed that the channel addressing counter $CT_1$ is at the value i=0 and that sample $x_0[(n+1)T]$ appears on input E of the filter. Just before the appearance of $x_0[(n+1)T]$, the following delayed values, which have been written in succession in a manner similar to that explained below, Since pages 0 of $M_1$ to $M_4$ remain selected after phase 4 of the reading and weighting operations, counter $CT_2$ indicates address 2, which is maintained throughout all the inter-memory transfer operations. These operations comprise execution of the following transfers, in succession:

$x_0[(n-10)T]$ from $M_3$ to $M_4$
$x_0[(n-6)T]$ from $M_2$ to $M_3$ and
$x_0[(n-2)T]$ from $M_1$ to $M_2$.

During these transfer operations, the arithmetic units $U_1$ to $U_4$ contain respectively (obviously for channel 0) the following partial results:

$$y_0^1[(n+1)T] = x_0[(n+1)T]h_0 + x_0[nT]h_1 + x_0[(n-1)T]h_2 + x_0[(n-2)T]h_3 \text{ in } U_1$$

$$y_0^2[(n+1)T] = x_0[(n-3)T]h_4 + x_0[(n-4)T]h_5 + x_0[(n-5)T]h_6 + x_0[(n-6)T]h_7 \text{ in } U_2$$

$$y_0^3[(n+1)T] = x_0[(n-7)T]h_8 + x_0[(n-8)T]h_9 + x_0[(n-9)T]h_{10} + x_0[(n-10)T]h_{11} \text{ in } U_3$$

$$y_0^4[(n+1)T] = x_0[(n-11)T]h_{12} + x_0[(n-12)T]h_{13} + x_0[(n-13)T]h_{14} + x_0[(n-14)T]h_{15} \text{ in } U_4$$

and the arithmetic units $U_2$ to $U_4$ compute, step by step, the sum of the partial results, result $y_0^h[(n+1)T]$ of cell no. h being simply multiplied by +1 in cell no. h+1, and the following total result is obtained on output S:

$$y_0[(n+1)T] = y_0^1[(n+1)T] + y_0^2[(n+1)T] + y_0^3[(n+1)T] + y_0^4[(n+1)T].$$

T/I seconds after the appearance of $x_0[(n+1)T]$, counter $CT_1$ increments by 1, changing from the address of channel 0 to the address of channel 1. Similarly, counter $CT_2$, which was at address 2 as indicated above, also increments by 1 and changes to address 3. Thereupon sample $x_1[(n+1)T]$ appears.

Just before the appearance of $x_1[(n+1)T]$, the following samples are at addresses 0, 1, 2 and 3 respectively of pages 1 of memories $M_1$ to $M_4$ corresponding to channel 1:

TABLE III

| Memory | Memory address | | | |
|---|---|---|---|---|
| | 0 | 1 | 2 | 3 |
| $M_1$ | $x_1(nT)$ | $x_1[(n-1)T]$ | $x_1[(n-2)T]$ | $x_1[(n-3)T]$ |
| $M_2$ | $x_1[(n-4)T]$ | $x_1[(n-5)T]$ | $x_1[(n-6)T]$ | $x_1[(n-3)T]$ |
| $M_3$ | $x_1[(n-8)T]$ | $x_1[(n-9)T]$ | $x_1[(n-10)T]$ | $x_1[(n-7)T]$ |
| $M_4$ | $x_1[(n-12)T]$ | $x_1[(n-13)T]$ | $x_1[(n-14)T]$ | $x_1[(n-11)T]$ |

When $x_1[(n+1)T]$ appears on input E, a write order $WEM_1$ stores this sample at address 3 of page 1 of memory $M_1$.

Processing then continues as explained above for pages 0, except that pages 1 are selected in memories $M_2$ to $M_4$ during the time T/I taken to obtain $y_1[(n+1)T]$.

The processing described is repeated for pages 2. For the last pages, i.e. pages 3, however, the processing is slightly different, following the reading and weighting phase 4, pages 3 of memories $M_1$ to $M_4$ are still selected and counter $CT_2$ indicates address 2. Counter $CT_2$ remains at address 2 during the transfer of $x_3[(n-10)T]$ from $M_3$ to $M_4$, of $x_3[(n-6)T]$ from $M_2$ to $M_3$ and of $x_3[(n-2)T]$ from $M_1$ to $M_2$. The calculation of $y_3[(n+1)T]$ is performed during this time:

$$y_3[(n+1)]=y_3^1[(n+1)T]=y_3^2[(n+1)T]+y_3^3[(n+1)T]+y_3^4[(n+1)T]$$

T/I second after the appearance of $x_3[(n+1)T]$, sample $x_0^3[(n+2)T]$ appears on input E and the counter $CT_1$ increments by 1, changing from address 3 to address 0, but counter $CT_2$ does not increment, therefore remaining at address 2.

Just before the appearance of $x_0[(n+2)T]$, the following delayed discrete values are obtained at addresses 0, 1, 2 and 3 respectively of pages 0 of memories $M_1$ to $M_4$:

TABLE IV

| Memory | Memory address | | | |
|---|---|---|---|---|
| | 0 | 1 | 2 | 3 |
| $M_1$ | $x_0[nT]$ | $x_0[(n-1)T]$ | $x_0[(n-2)T]$ | $x_0[(n+1)T]$ |
| $M_2$ | $x_0[(n-4)T]$ | $x_0[(n-5)T]$ | $x_0[(n-2)T]$ | $x_0[(n-3)T]$ |
| $M_3$ | $x_0[(n-8)T]$ | $x_0[(n-9)T]$ | $x_0[(n-6)T]$ | $x_0[(n-7)T]$ |
| $M_4$ | $x_0[(n-12)T]$ | $x_0[(n-13)T]$ | $x_0[(n-10)T]$ | $x_0[(n-11)T]$ |

A write order then stores $x_0[(n+2)T]$ at address 2 of page 0 of memory $M_1$ in place of $x_0[(n-2)T]$. Since pages 0 of memories $M_1$ to $M_4$ are thus selected, the reading of the delayed discrete values in page 0 of memories $M_1$ to $M_4$ and their weighting by the associated coefficients are ordered in four phases from address 2 of the memories as follows:

TABLE V

| Memory | Phase | | | |
|---|---|---|---|---|
| | 1 | 2 | 3 | 4 |
| $M_1$ | $x_0[(n+2)T]h_0$ | $x_0[(n+1)T]h_1$ | $x_0[nT]h_2$ | $x_0[(n-1)T]h_3$ |
| $M_2$ | $x_0[(n-2)T]h_4$ | $x_0[(n-3)T]h_5$ | $x_0[(n-4)T]h_6$ | $x_0[(n-5)T]h_7$ |
| $M_3$ | $x_0[(n-6)T]h_8$ | $x_0[(n-7)T]h_9$ | $x_0[(n-8)T]h_{10}$ | $x_0[(n-9)T]h_{11}$ |
| $M_4$ | $x_0[(n-10)T]_{12}$ | $x_0[(n-11)T]h_{13}$ | $x_0[(n-12)T]h_{14}$ | $x_0[(n-13)T]h_{15}$ |

The value of $y_0[(n+2)T]$ is calculated:

$$y_0[(n+2)T]=y_0^1[(n+2)T]+y_0^2[(n+2)T]+y_0^3[(n+2)T]+y_0^4[(n+2)T]$$

in the same manner as described above for $y_0[(n+1)T]$.

In general, counter $CT_1$ increments by 1 every T/I second, counter $CT_3$ is reset to 0 every T/I second, and counter $CT_2$ is incremented by 1 every T/I second, except when changing from channel I-1 to channel 0, in which case, counter $CT_2$ does not change.

Naturally, if $k=1$, there is no effective transfer of the delayed discrete values, each incident sample being written in place of the oldest sample in the single RAM.

It is obvious that if the sampled signals are received over a single channel, counter $CT_1$ may be eliminated and memories $M_1$ to $M_K$ will then each comprise only one page.

The processing method defined by the present invention is much faster than previously known methods, especially when it is required to process a large number of delayed discrete values since, according to former methods, use was made of a filter comprising M delay cells in cascade and during each sampling time slot T a total of M.I delayed discrete value shift operations, M.I multiply operations and M.I add operations, i.e. 3.M.I operahad to be performed for I channels in an interval less than T seconds.

Thus, in the case of telephone switching, if $T=62.5$ μs, $M=128$ and $I=32$, it was priorly necessary to execute $64 \times 10^6$ operations in less than one second, which is impossible with presently known devices (the performance of known devices enabling only one channel to be processed with a 32-order filter for a sampling frequency of 8 kHz).

On the other hand, by means of the method defined by the present invention, only K out of the $M=KP-1$ delayed discrete values of each channel are shifted, the value of P being selected such that with presently available devices the total processing time for I channels, i.e. the time required for processing $I \times P$ values by an arithmetic unit (all the arithmetic units $U_1$ to $U_K$ operating simultaneously) and the time required for adding $I \times K$ partial results are less than the sampling period T divided by the number of channels I. In the case of telephone switching, for example, in order to process signals transmitted over 32 channels with a sampling frequency of 8 kHz (i.e. T/I=approximately 3.9 μs), it is thus possible with only two elementary cells to process in approximately 3.6 μs more than 40 delayed discrete values per channel, the above-mentioned TRW integrated-circuit being capable of reading and weighting a 16-bit word in 155 ns at the most, the result being available on the arithmetic unit output approximately 35 ns after the end of calculation.

In the case of applications for which a very high-order filter is required, it is merely necessary to increase the number of elementary cells, but in this case the time required for adding the different partial results of these cells may be excessive. In this case, the filter illustrated in FIG. 2 is used, in which components identical with those in FIG. 1 have the same reference numbers.

Figure 2:
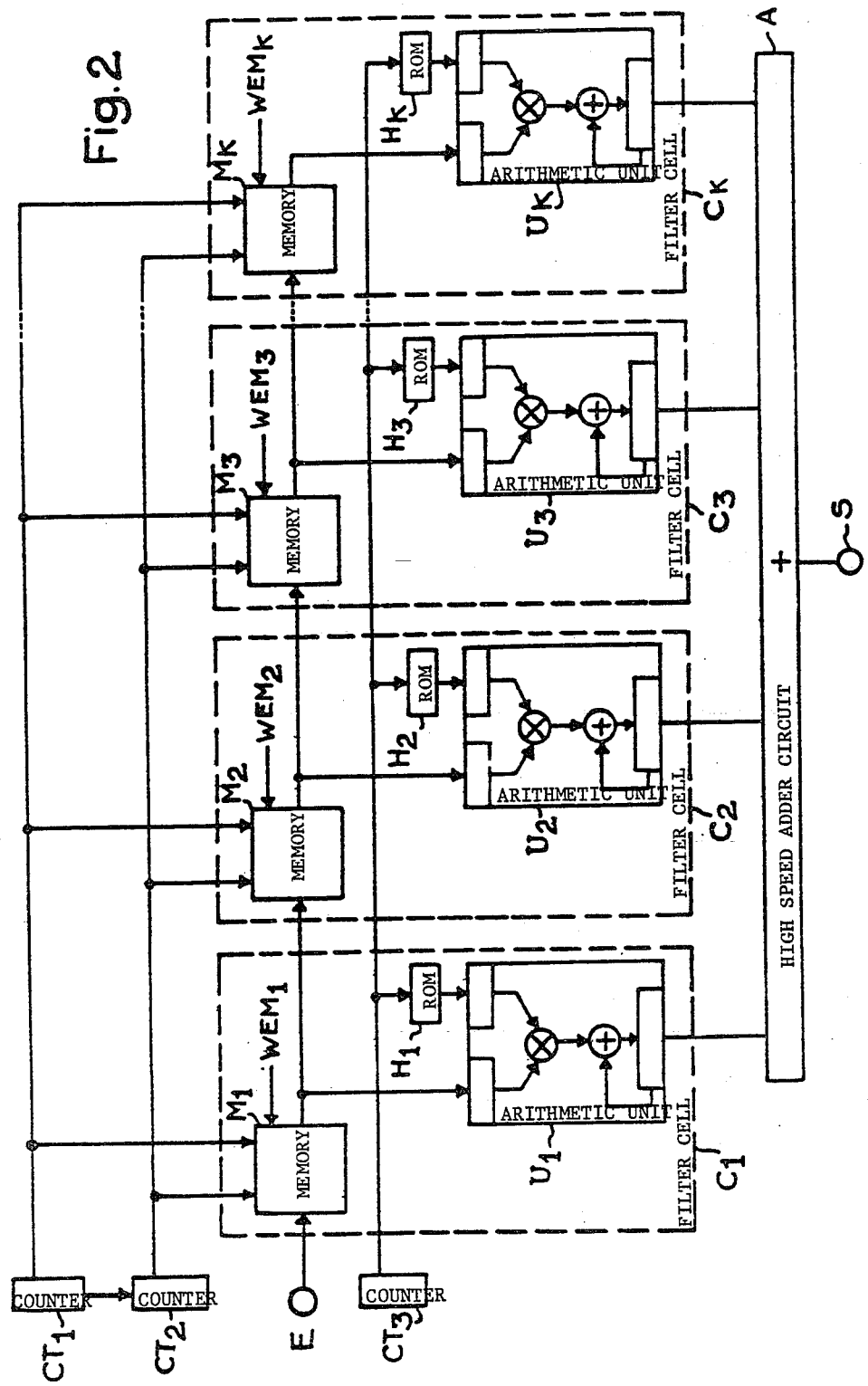
FIG. 2 is the block diagram of another embodiment of the filter illustrated by FIG. 1.

The filter shown in FIG. 2 is identical with that in FIG. 1, except that the outputs of the different arithmetic units $U_1$ to $U_K$ are all connected to a high-speed adder A which simultaneously sums all the partial results produced by K cells $C_1$ to $C_K$. Except for this difference, the filter shown in FIG. 2 operates in the same manner as that shown in FIG. 1, and for this reason, its operation is not explained in detail.

As an example, by means of the filter shown in FIG. 1, with $K=2$, i.e. with only two elementary cells, and with $P=30$, i.e. $M=59$, it is possible to process 16-bit words of 32 channels in approximately 3.6 μs, the components required to manufacture this filter occupying only one half of a standard printed-circuit board.

The following describes the application of the digital filter in accordance with the present invention to manufacture an extrapolator network.

When it is required to digitally filter a signal sampled at a frequency $F_e$ in order to retain only those spectral components of the signal lying within the interval $-f_c$ to $+f_c$, it is merely necessary to restore the filter output signal with a sampling frequency $F_e=2f_c$. When $F_e=4f_c$, it is advantageous to perform the filtering function by extrapolation, using a half-band, non-recursive filter cell whose response to a pulse is of the type sin x/x.

This results in considerably reduced calculating speed and negligible phase distortion. In addition, it is known that the output signal of an extrapolator network is sampled at a frequency of $F_e/2$, which would imply calculating all the output samples and then eliminating every other sample, but in practice it is preferable to calculate the output samples at a frequency of $F_e/2$. Moreover, it is known that if the coefficient $h'_M$ of the middle component of the response to an input pulse is made 1 for an M'-order extrapolator network, where $M'=2P'-1$, P' being an even whole number, the remaining coefficients are symmetrical with respect to $h'_M$, all the odd-numbered coefficients $h_M$ cancel except for $h'_M$, and the number of arithmetic operations to be performed is reduced by a factor of almost 2.

Figure 3:
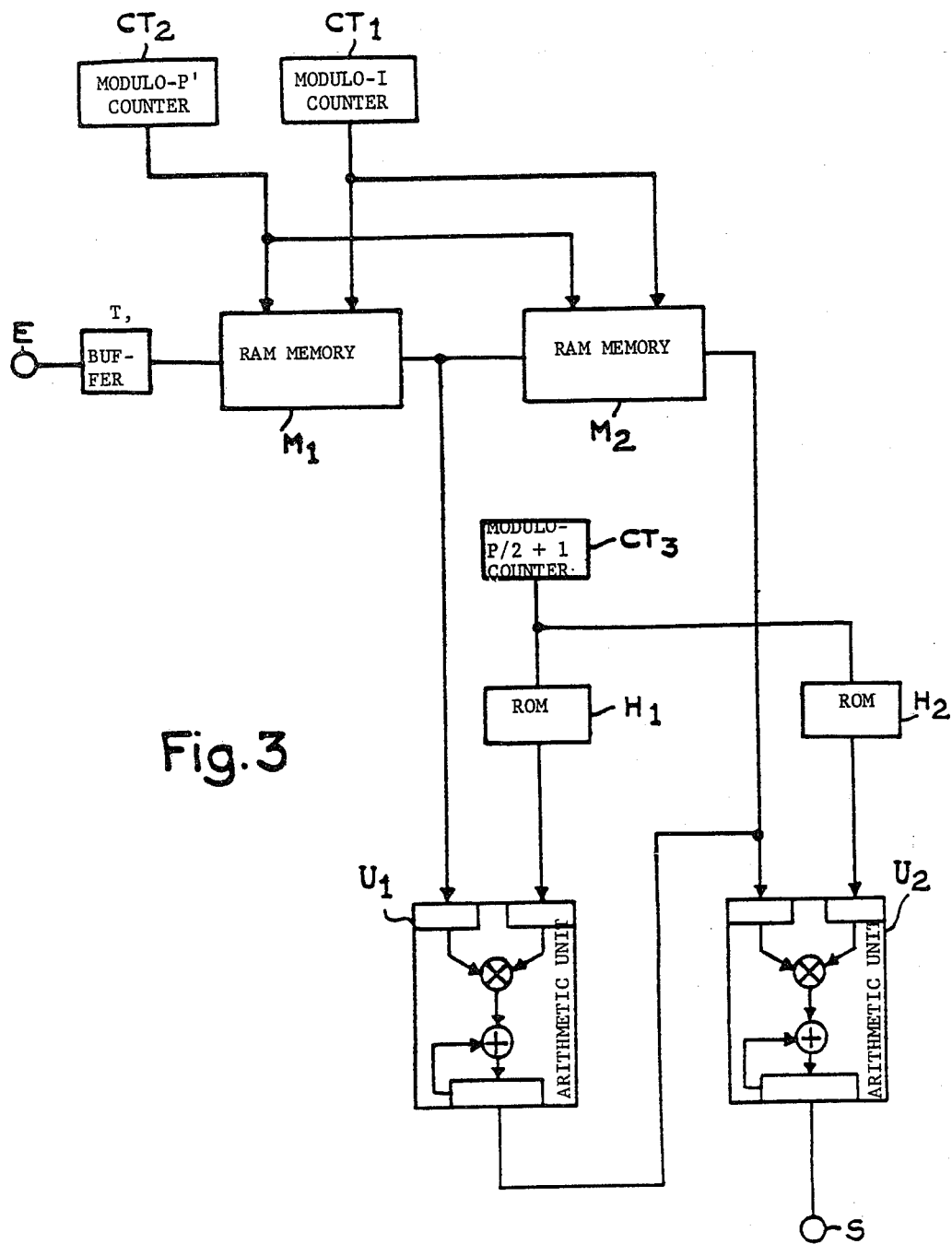
FIG. 3 is the block diagram of an extrapolator digital filter in accordance with the present invention.

FIG. 3 shows an N'-order extrapolator network, where $N'=2P'-1$, manufactured in accordance with the principles described above. This network comprises a digital filter, such as that shown in FIG. 1, having two elementary cells, each containing P' delayed discrete values, it obviously being possible also to use the digital filter shown in FIG. 2.

Since the input signal sampling frequency is twice the calculation frequency, a network input buffer T is provided for storing two samples. Since the other components of the network shown in FIG. 3 are identical with those shown in FIG. 1, they are not described in any further detail.

The following describes the operation of the network shown in FIG. 3 by means of a simplified example.

In order to simplify the description, a single channel is examined and a low-order filter with two elementary cells is considered, such as a filter of order $M'=11$, but the description is still valid for a much higher order filter, as is the case in practice.

Since the order of the filter is 11, it should contain 12 delayed discrete values, i.e. the delayed discrete values $x(nT)$ to $x[(n-8)T]$ for example at the instant $x(nT)$ appears, it being understood that $x[(n-4)T]$ and $x[(n-5)T]$ are simultaneously in $M_1$ and $M_2$. As recalled above, the odd-numbered coefficients $h_M$, except for $h'_M$ are zero, i.e. $h_1$, $h_3$, $h_7$, $h_9$ and $h_{11}$ are zero.

At instant $x(nT)$, the following delayed discrete values are in memories $M_1$ and $M_2$:

| Memory | Memory address | | | | | |
|---|---|---|---|---|---|---|
| | 0 | 1 | 2 | 3 | 4 | 5 |
| $M_1$ | $x(nT)$ | $x[(n-1)T]$ | $x[(n-2)T]$ | $x[(n-3)T]$ | $x[(n-4)T]$ | $x[(n-5)T]$ |
| $M_2$ | $x[(n-6)T]$ | $x[(n-7)T]$ | $x[(n-8)T]$ | $x[(n-9)T]$ | $x[(n-4)T]$ | $x[(n-5)T]$ |

Since the output sample calculation frequency is $F_e/2$, the next instant to be considered is $x[(n+2)T]$. Samples $x[(n+2)T]$ and $x[(n+1)T]$ are, thus, written into $M_1$ in place of $x[(n-4)T]$ and $x[(n-5)T]$, respectively.

The read phase of memories $M_1$ and $M_2$ starts with the latest samples, i.e. $x[(n+2)T]$ and $x[(n-4)T]$, respectively. The address common to both memories is incremented by 2, except for the last incrementation which is only 1, since after the next to last incrementation there remains only one delayed discrete value to be read in each memory. The following are therefore read in succession:

$x[(n+2)T]$, $x(nT)$, $x[(n-2)T]$ and $x[(n-3)T]$ for $M_1$
$x[(n-4)T]$, $x[(n-6)T]$, $x[(n-8)T]$ and $x[(n-9)T]$ for $M_2$ and at the same time weighting by the appropriate coefficients occurs, i.e. $h_0$, $h_2$, $h_4$ and $h_5$ respectively for $M_1$, and $h_6$, $h_8$, $h_{10}$ and $h_{11}$ respectively for $M_2$.

All the partial values obtained in this manner are then added, the memories being at the address of the oldest delayed discrete value, i.e. at address 3 at which $x[(n-3)T]$ is found in $M_1$ and $x[(n-9)T]$ is found in $M_2$, the value contained in $M_1$ at address 3 is transferred into $M_2$ in place of the value which was contained at the same address. The address common to $M_1$ and $M_2$ is then decremented by 1, changing to 2, at which $x[(n-2)T]$ is found in $M_1$ and $x[(n-8)T]$ is found in $M_2$, and the contents of $M_1$ at address 2 is transferred into $M_2$ at the same address. This second transfer is completed just before the appearance of the next two samples, i.e. $x[(n+4)T]$ and $x[(n-3)T]$, which are written in place of $x[(n-2)T]$ and $x[(n-3)T]$ respectively. The cycle described above then repeats.

It should be noted that the addressing counter $CT_2$ for reading the delayed discrete values in $M_1$ and $M_2$ is modulo-P', that counter $CT_3$ is modulo-$(P'/2+1)$, and that the address of the first delayed discrete value read in each memory during a reading and weighting cycle is always less by 2 than the address of the first delayed discrete value read in these same memories during the previous reading and weighting cycle.

It should also be noted, as for the general case described above, that the extrapolator network can execute the shared-time processing on I channels, for example I=32.

As an example, it was possible to produce a 32-channel 55-order extrapolator filter with a sampling frequency of 16 kHz, having a processing time of approximately 3.6 μs with an attenuation of 0.1 dB in the pass-band and at least 70 dB of attenuation outside of this band.

Figure 4:
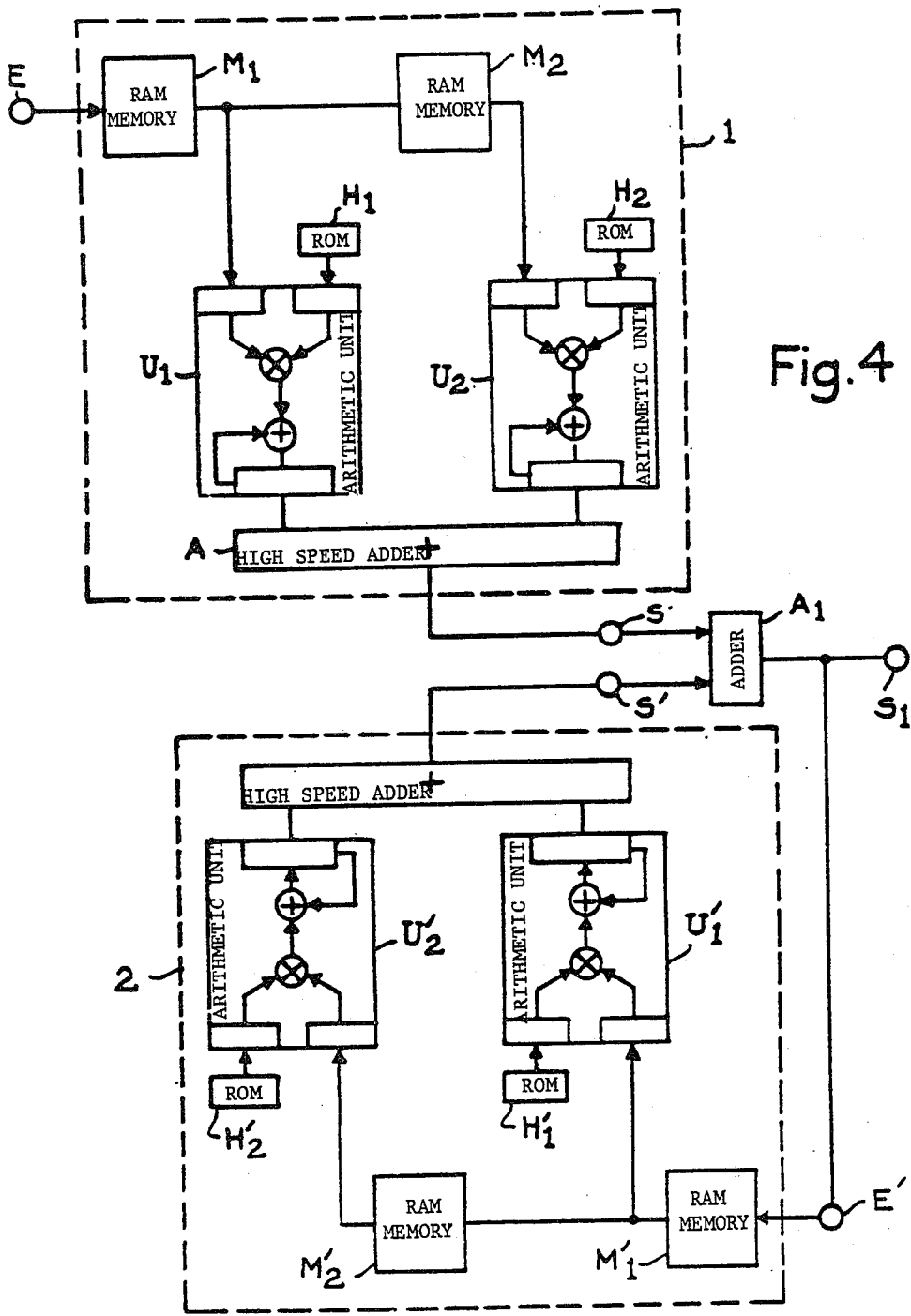
FIG. 4 is the block diagram of a recursive digital filter comprising two transversal filters of the type shown in FIG. 2.

FIG. 4 schematically illustrates the application of the transversal filter in accordance with the invention to produce a recursive filter.

Each of the large squares 1 and 2 shows, in a simplified manner by omitting all the counters, a non-recursive filter such as that shown in FIG. 2, with K=2, the filter inputs and outputs of squares 1 and 2 being designated by E, E', S and S' respectively.

Input E is the input of the recursive filter, Outputs S and S' are connected to an adder $A_1$, whose output is connected simultaneously to an output terminal $S_1$ and to the input E' of the filter shown in square 2. This, thus, comprises a recursive filter consisting of two transversal filters, each operating in the manner described above, the whole of the recursive filter between the input terminal E and the output terminal $S_1$ operating in a known manner and not described in any further detail.

In conclusion, since the process described by the present invention enables the delayed discrete values to be shifted by relative and simultaneous addressing of each of the memories, the time required for the fictive shifting of delayed discrete values is therefore negligible.

Because of the division of the filter into K elementary cells each containing P values, the time required for synthesizing the output sample of the complete filter is little more than the time required for synthesizing the output sample of an elementary cell. It is, therefore, possible to operate a very high-order (e.g. 256) digital filter for the shared-time processing of several channels (e.g. 32) with sampling frequencies of 8 or 16 kHz per channel. Moreover, the filter is simple to produce and of small size.

One skilled in the art may make various changes and substitutions to the layout of parts shown without departing from the spirit and scope of the invention.

What I claim is:

1. A method for processing successive signal samples, for example, the signals which appear on a plurality of time-multiplexed transmission channels, comprising the steps of: during each sampling time slot and for each channel, writing the current sample into one of a plurality of random access memories in place of the oldest priorly written sample, all of the samples for a given channel being read into said memory in succession starting with that which has just been written and progressing to other memories in the order of increasing age to the oldest sample; simultaneously reading all of said memories in the order of increasing age starting with the sample which has just been written; sending the samples thus read from each memory to a corresponding arithmetic unit; summing the results produced by the different arithmetic units; and then, said progressing of memories comprising transferring the oldest sample from each memory to the next memory, starting with the next to last memory, said memories being arranged in the order of increasing age of their contents.

2. The method in accordance with claim 1 applied to an extrapolator network, comprising the further steps of: after reading the latest sample, incrementing each memory by 2, except for the last reading for which the incrementation is by 1 only; and reading the address of the first delayed discrete value in each memory during a reading and weighting cycle such that said address is always less than the address of the first delayed discrete value read in said memories during the previous reading and weighting cycle by 2.

3. The method in accordance with claim 2, wherein two or more memories are used, comprising the further step of: during the transfer phase between memories, transferring two delayed discrete values each time.

4. An M-order digital filter for the shared-time processing of digital signals appearing on I channels, which comprises:

(a) K processing cells, K being a whole number equal to or greater than 1, each of said K cells comprising: a random access memory organized in I pages, each page corresponding to a channel and capable of storing at least P words of q bits each, where M=KP−1, said memory being intended for storing delayed discrete values; a read-only memory having a capacity of at least P words of r bits each for storing the weighting coefficients of the different delayed discrete values; and an arithmetic unit connected to said random access memory and said read-only memory;

(b) a modulo-I counter, common to the K cells, for addressing the I pages of said K random access memories;

(c) a first modulo-P counter, common to the K cells, for ordering the writing, reading and transfer of the said delayed discrete values; and (d) a second modulo-P counter, common to the K cells, for addressing the weighting coefficients corresponding to the operation to be performed.

5. A digital filter in accordance with claim 4, further comprising an adder common to the K processing cells for summing the various partial results produced by said K arithmetic units.

6. A digital filter according to claim 4 or 5 wherein to act as a M'-order filter where M'=(2P'−1), P' being an even, whole number, said filter further comprises an input buffer connected to said random access memories, said first modulo-P counter is modulo-P' counter, and said second modulo-P counter is a modulo-(P'/2+2) counter.

* * * * *